US009520294B2

(12) United States Patent
Agarwal et al.

(10) Patent No.: US 9,520,294 B2
(45) Date of Patent: Dec. 13, 2016

(54) ATOMIC LAYER ETCH PROCESS USING AN ELECTRON BEAM

(71) Applicant: APPLIED MATERIALS, INC., Santa Clara, CA (US)

(72) Inventors: Ankur Agarwal, Fremont, CA (US); Rajinder Dhindsa, Pleasanton, CA (US); Shahid Rauf, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/505,148

(22) Filed: Oct. 2, 2014

(65) Prior Publication Data

US 2016/0064244 A1     Mar. 3, 2016

Related U.S. Application Data (60) Provisional application No. 62/043,619, filed on Aug. 29, 2014.

(51) Int. Cl.
| | | |
|---|---|---|
| H01L 21/311 | (2006.01) | |
| H01L 21/3065 | (2006.01) | |
| H01L 21/306 | (2006.01) | |
| H01L 21/3213 | (2006.01) | |
| B81C 1/00 | (2006.01) | |
| H01J 37/32 | (2006.01) | |

(52) U.S. Cl.
CPC ..... *H01L 21/30655* (2013.01); *B81C 1/00531* (2013.01); *H01J 37/32357* (2013.01); *H01J 37/32706* (2013.01); *H01L 21/3065* (2013.01); *H01L 21/30621* (2013.01); *H01L 21/31111* (2013.01); *H01L 21/31116* (2013.01); *H01L 21/32135* (2013.01)

(58) Field of Classification Search
None
See application file for complete search history.

(56) References Cited

U.S. PATENT DOCUMENTS

| | | | |
|---|---|---|---|
| 7,416,989 B1 * | 8/2008 | Liu | H01L 21/02063 438/706 |
| 2007/0163994 A1 * | 7/2007 | Rauf et al. | 216/62 |
| 2010/0193781 A1 * | 8/2010 | Tripathy et al. | 257/43 |
| 2011/0139748 A1 * | 6/2011 | Donnelly | H01J 37/32036 216/37 |
| 2012/0097870 A1 * | 4/2012 | Leray | H01J 37/32669 250/505.1 |

OTHER PUBLICATIONS

Co-Pending U.S. Appl. No. 14/505,168, filed Oct. 2, 2014.
Official Action Dated Oct. 14, 2015 Issued in Co-Pending U.S. Appl. No. 14/505,168.
Agarwal, A., and Kushner, M.J., "Plasma Atomic Layer Etching Using Conventional Plasma Equipment." Journal of Vacuum Science and Technology, Jan./Feb. 2009, pp. 37-50, American Vacuum Society, United States.

* cited by examiner

*Primary Examiner* — Calvin Choi
*Assistant Examiner* — Xiaoming Liu
(74) *Attorney, Agent, or Firm* — Robert M. Wallace (57) ABSTRACT

Atomic layer etching using alternating passivation and etching processes is performed with an electron beam plasma source, in which the ion energy is set to a low level below the etch threshold of the material to be etched during passivation and to a higher level above the etch threshold during etching but below the etch threshold of the unpassivated material.

16 Claims, 5 Drawing Sheets

FIG. 10

ATOMIC LAYER ETCH PROCESS USING AN ELECTRON BEAM

CROSS-REFERENCE TO RELATED APPLICATIONS

This application claims benefit of U.S. Provisional Application Ser. No. 62/043,619, filed Aug. 29, 2014 entitled FAST ATOMIC LAYER ETCH PROCESS USING AN ELECTRON BEAM AND A SINGLE PROCESS GAS, by Ankur Agarwal, et al.

BACKGROUND

Technical Field

The disclosure concerns a plasma-enhanced reactive ion etch (PERIE) process for a workpiece such as a semiconductor wafer.

Background Discussion

In conventional atomic layer etching, a PERIE process removes an overlying layer {e.g., silicon dioxide) formed on a base layer (e.g., crystalline Silicon) of a workpiece, which may be a silicon wafer for example. The removal is performed one atomic layer at a time, as follows: The top atomic layer is passivated by a exposing the workpiece to a passivating process gas for the amount of time required for just one atomic layer to react with the passivating process gas, leaving underlying atomic layers unchanged. The one atomic layer that has been thus passivated may be referred to as the passivated layer. Species from the passivating process gas are chemically bound with material in the passivated layer, altering its characteristics. The passivated layer is susceptible to etching by a particular etch species, while the underlying layers remain relatively impervious to the particular etch species. The passivated layer is then etched by removing the passivating process gas and exposing the workpiece to a different process gas, namely an etching process gas containing the particular etch species. The foregoing processes of passivation and etching, including the changes of process gases, are then repeated for the next atomic layer. The cycle is continued until all atomic layers have been removed. One problem with this conventional process is that the RF bias voltage, typically of a sinusoidal type of waveform, produces a wide distribution of ion energies among the population of ions. Moreover, use of a capacitively or inductively coupled plasma source contributes to ion energy distribution and width of the ion energy distribution. A wide ion energy distribution leads to imprecise control over the thickness of material removed in each successive etching operation, so that the thickness may deviate from that of a single atomic layer.

SUMMARY

A method is provided for removing from a workpiece a succession of layers of an overlying film of a first material formed on a base surface of a second material in a reactor chamber. The method includes providing an electron beam in the chamber, coupling an RF bias voltage to the workpiece, performing a passivation process for a time duration corresponding to a desired thickness of a layer of the first material to be passivated, and performing an etching process. The passivation process includes introducing a passivation process gas into the chamber and setting energy of ions in the chamber to a first ion energy level less than a first minimum ion energy required for etching the overlying film. The etching process includes introducing an etching process gas into the chamber and setting energy of ions in the chamber to a second ion energy level exceeding the first minimum ion energy.

In one embodiment, the second ion energy level is less than a second minimum ion energy required to etch the second material. In one embodiment, the desired thickness is one atomic layer of the material. In one embodiment, the passivating is performed for a time duration sufficiently short to limit thickness of the layer to one atomic layer.

In one embodiment, the passivating gas contains a halogen species. In one embodiment, the passivating gas contains Chlorine. In one embodiment, the first material comprises Silicon dioxide and the second material comprises crystalline Silicon.

In one embodiment, the setting ion energy of ions to a first ion energy level comprises tailoring a time domain waveform of the RF bias voltage to an RF waveform in which the RF voltage is at a level corresponding to the first ion energy level for a duration of at least 50% of an RF cycle of the RF waveform. In one embodiment, the setting ion energy of ions to a second ion energy level comprises tailoring a time domain waveform of the RF bias voltage to an RF waveform in which the RF voltage is at a level corresponding to the second ion energy level for a duration of at least 50% of an RF cycle of the RF waveform.

In accordance with another aspect, a method is provided for atomic layer etching of an overlying film of a first material formed on a base surface of a second material of a workpiece in a reactor chamber. The method includes directing an electron beam into the chamber, coupling an RF bias voltage to the workpiece, passivating a predetermined thickness of a layer of the first material, and etching the predetermined thickness of the layer. The method further includes, during the passivating, setting energy of ions in the chamber to a first ion energy level less than a first minimum ion energy for etching the layer by tailoring a time domain waveform of the RF bias voltage in accordance with the first ion energy level. The method further includes, during the etching, setting energy of ions in the chamber to a second ion energy level exceeding the first minimum ion energy by tailoring a time domain waveform of the RF bias voltage in accordance with the second ion energy level.

In one embodiment, the method further comprises limiting the passivating to a time duration corresponding to the predetermined thickness.

In one embodiment, the predetermined thickness corresponds to a predetermined number of atomic layers of the layer. In one embodiment, the predetermined thickness corresponds to a single atomic layers of the layer.

In one embodiment, the method further comprises repeating the passivating and etching in successive operations until removal of the layer is complete.

In one embodiment, the method further comprises introducing a passivating process gas during the passivating and introducing an etch process gas during the etching.

In one embodiment, during the passivating, the tailoring comprises conforming a time domain waveform of the RF bias voltage to a shape that produces an ion energy distribution function having a population peak at the first ion energy level. In one embodiment, during the etching, the tailoring comprises conforming a time domain waveform of the RF bias voltage to a shape that produces an ion energy distribution function having a population peak at the first ion energy level.

In accordance with a yet further aspect, a method is provided of performing atomic layer etching on a workpiece in alternating operations of passivating and etching. The method comprises, during the passivating, tailoring RF bias power to a waveform in which RF voltage is at a level corresponding to a first ion energy level less than an etch threshold of a deposited layer on the workpiece for a duration of at least 50% of an RF cycle of the waveform. The method further comprises, during the etching, tailoring RF bias power to a waveform in which RF voltage is at a level corresponding to a second ion energy level exceeding an etch threshold of a deposited layer on the workpiece for a duration of at least 50% of an RF cycle of the waveform.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
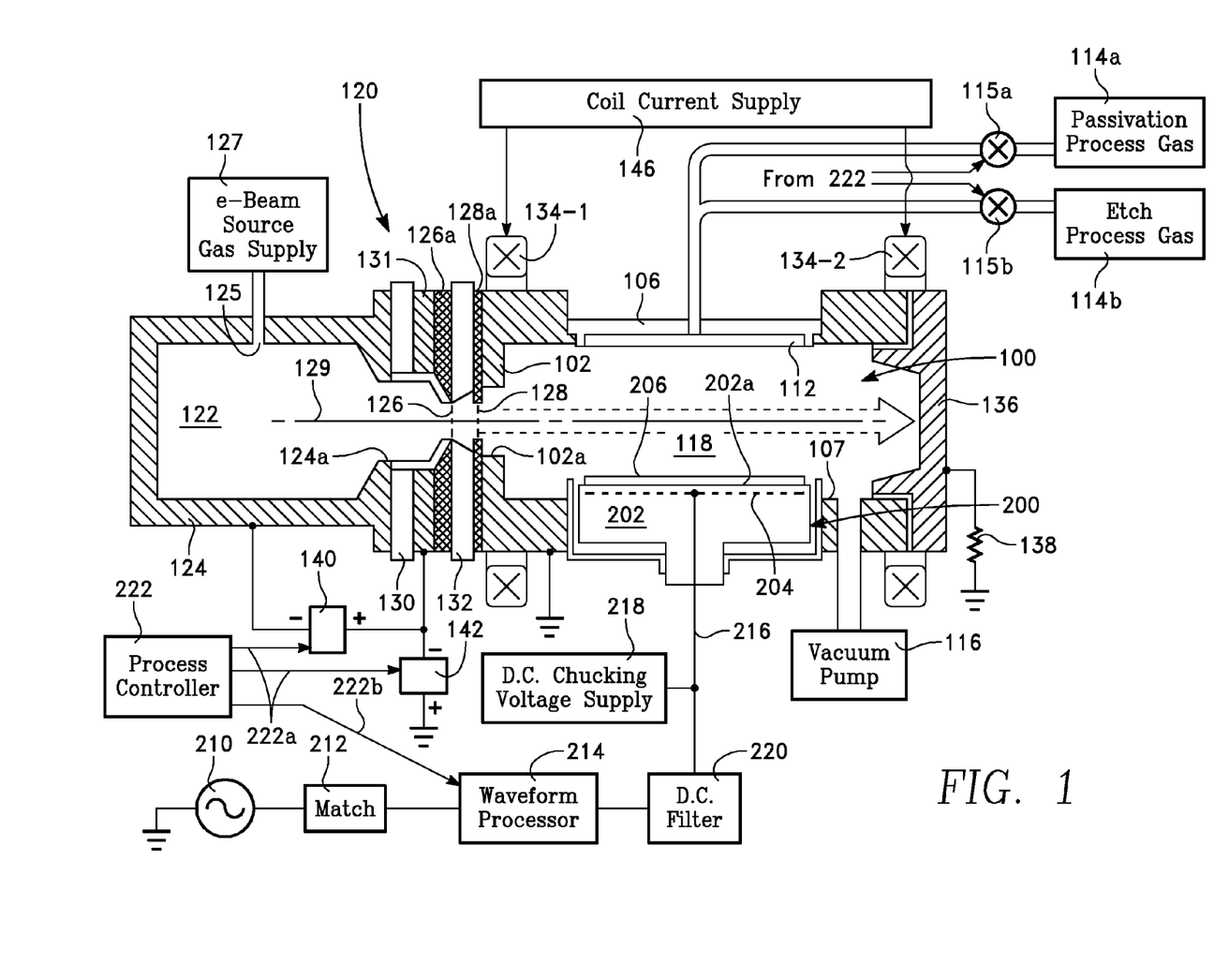
FIG. 1 depicts a cross-sectional side view of a first embodiment of a plasma reactor.

Referring to FIG. 1, a plasma reactor has an electron beam generator as a plasma source. The reactor includes a processing chamber 100 enclosed by a cylindrical side wall 102, a floor 107 and a ceiling 106. A workpiece support pedestal 200 includes a puck 202 having a support surface 202a which supports a workpiece 206, such as a semiconductor wafer, the workpiece support pedestal 200 being movable in the axial (e.g., vertical) direction. A gas distribution plate 112 is integrated with or mounted on the ceiling 106, and receives process gas from process gas supplies 114a and 114b through respective valves 115a and 115b. A vacuum pump 116 evacuates the processing chamber 100 through a passage in the floor 107. A processing region 118 is defined between the workpiece support pedestal 200 and the gas distribution plate 112. Within the processing region 118, process gas is ionized to produce a plasma for processing of the workpiece 206. The plasma is generated in the processing region 118 by an electron beam from an electron beam source 120.

An electrode 204 within the puck 202 underlies the support surface 202a. An RF bias power generator 210 is coupled through an impedance match 212 and through a waveform tailoring processor 214 to the electrode 204 via a center conductor 216 extending through the workpiece support pedestal 200. RF power is capacitively coupled from the electrode to the workpiece 206. In one embodiment, a D.C. chucking voltage supply 218 may be connected to the center conductor 216, and a D.C. blocking filter 220 may be provided between the waveform tailoring processor 214 and the D.C. chucking voltage supply 218.

A process controller 222 has an electron beam energy control output 222a coupled to the electron beam source 120 to control electron beam energy level. In one implementation, the electron beam energy control output 222a governs the output voltage level of a voltage supply of the electron beam source 120.

The controller 222 has an ion energy control output 222b coupled to the waveform tailoring processor 214 to control ion energy at the surface of the workpiece 206. As will be explained later in this specification, the ion energy is controlled through the waveform tailoring processor 214 by governing the waveform of the RF bias power (voltage or current) applied to the electrode 204 to achieve a desired ion energy level.

The reactor of FIG. 1 is useful for performing atomic layer etch processes (or atomic layer deposition processes). In such a process, the layer to be etched (e.g., a dielectric material such as Silicon dioxide or Silicon nitride) is removed one atomic layer at a time in successive cycles without etching the underlying layer (e.g., a silicon substrate). In an alternative embodiment, the number of atomic layers removed during each cycle may be a selected number greater than one.

In the conventional version of such a process, a conventional plasma reactor is employed (not the reactor of FIG. 1), and the top atomic layer is passivated by a exposing it to a passivating process gas for the amount of time required for just one atomic layer to react with the passivating process gas, leaving underlying atomic layers unchanged. The one atomic layer that has been thus passivated may be referred to as the passivated layer. Species from the passivating process gas are chemically bound with material in the passivated layer, altering its characteristics. The passivated layer is susceptible to etching by a particular etch species, while the underlying layers remain relatively impervious to the particular etch species. The passivated layer is then etched by removing the passivating process gas and exposing the workpiece to an etch process gas containing the particular etch species. The foregoing processes of passivation and etching, including the changes of process gases, are then repeated for the next atomic layer. The cycle is continued until all atomic layers have been removed. One problem with this conventional process is that the RF bias voltage, typically of a sinusiodal type of waveform, produces a wide distribution of ion energies among the population of ions. Moreover, use of a capacitively or inductively coupled plasma source contributes to ion energy distribution and width of the ion energy distribution. A wide ion energy distribution leads to imprecise control over the thickness of material removed in each successive etching operation, so that the thickness may deviate from that of a single atomic layer.

Embodiments disclosed herein perform precise atomic layer etching using the reactor of FIG. 1 in alternating processes of passivation and etching. Prior to passivation, the chamber is evacuated. During the passivation, a passivation process gas (such as a gas containing Chlorine species) is introduced into the chamber from the process gas supply 114a through the valve 115a. The valve 115a may be controlled by the process controller 222. Also during passivation, the ion energy at the workpiece surface is set below an ion energy level that is less than the threshold for etching of the layer being passivated. Then, during etching, an etch process gas (such as a gas containing Argon) is introduced into the chamber from the gas supply 114b through the valve 115b. The valve 115b may be controlled by the process controller 222. During etching, the ion energy at the workpiece surface is set above the threshold for etching the passivated material but below a threshold for etching the base layer of the workpiece. By limiting ion energy to be less than a threshold for etching the base layer of the workpiece, the process stops upon removal of all the deposited material over the base layer.

During passivating and during etching, a narrow or sharp ion energy distribution at (or centered at) the desired ion energy is obtained by tailoring or shaping the waveform of the RF bias voltage (or current) on the electrode 204. The waveform tailoring is performed by the waveform tailoring processor 214. In one embodiment, the waveform tailoring produces an RF bias voltage waveform having an ion energy distribution function having a sharp peak at the desired ion energy. In one embodiment, the RF voltage waveform is tailored so that the RF bias voltage spends a large amount of time during each cycle at the voltage level corresponding to the desired ion energy level. The amount of time spent at the voltage level corresponding to the desired ion energy level may be 50% to 80% of each RF cycle, for example. During passivation, the waveform is set to a tailored shape at which the ion energy is narrowly distributed below the etch threshold referred to above. During etching, the waveform is set to a tailored shape at which the ion energy is narrowly distributed above the etch threshold referred to above but below the etch threshold of the base layer of the workpiece. Advantageously, the ion energy distributions obtained by such waveform tailoring are very narrow. Moreover, the electron beam source 120 produces ions of extremely low energies, and therefore does not contribute appreciably to width of ion energy distribution. As a result, width of ion energy distribution is narrow so that, during passivation, no ions (or only a negligible number of ions) have energies exceeding the etch threshold. Moreover, during etching, no ions (or only a negligible number of ions) have energies below the etch threshold of the passivated material or above the etch threshold of the unpassivated material. An advantage is that the atomic layer etch process is more precise.

Figure 2:
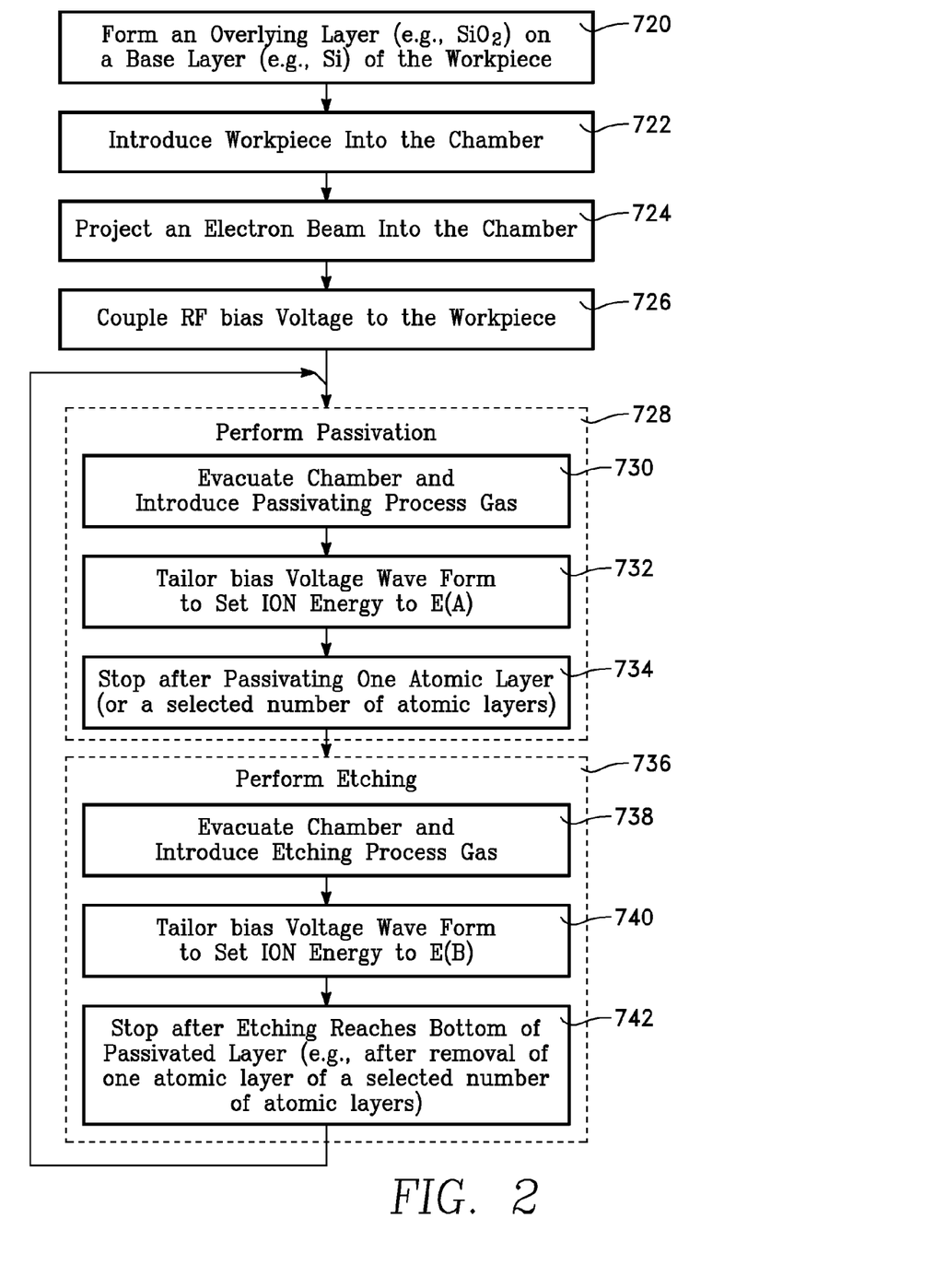
FIG. 2 is a block flow diagram of a process performed by the reactor of FIG. 1.

Referring now to FIG. 2, the process is controlled by the process controller 222. The process begins after deposition or formation of a layer to be etched (e.g., Silicon dioxide) on a base layer (e.g., Silicon) of a workpiece or wafer (block 720 of FIG. 2). The workpiece is placed in the chamber of the reactor of FIG. 1 (block 722). An electron beam is directed into a process region of the chamber (block 724 of FIG. 2). An RF bias voltage is coupled to the workpiece (block 726), e.g., by capacitive coupling. Then, the top-most atomic layer of the deposited layer is passivated (block 728). The passivation process of block 728 consists of the following: Evacuating the chamber and then introducing into the chamber a passivating process gas (block 730) from the gas supply 114a through the valve 115a. During or throughout the passivation process, the ion energy at the workpiece surface is set to a level E(A) below the etch threshold of the deposited material (block 732) by tailoring of the RF bias voltage waveform. Then, after a time duration required for the passivation to reach the bottom of the first or top-most atomic layer of the deposited material, the passivation is halted (block 734), e.g., by closing the valve 115a. Thereafter, etching is performed (block 736). The etching process of block 736 includes the following: Evacuating the chamber and then introducing into the chamber an etch process gas such as Argon (block 738) from the gas supply 114b by opening the valve 115b governing etch process gas flow. During or throughout the etching process, the ion energy at the workpiece surface is set to a level E(B) above the etch threshold of the deposited material and below the etch threshold of the base layer of the workpiece by tailoring the RF bias waveform (block 740). Then, upon etching through to the bottom of the top atomic layer of the deposited material, the etch process is halted (block 742), e.g., by closing the valve 115b. Thereafter, the entire process is repeated to remove the next atomic layer, starting with the passivation of block 728.

Figure 2A:
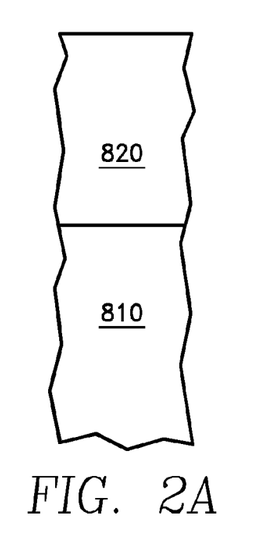
FIGS. 2A, 2B and 2C are chronologically successive side views of a workpiece and depict a sequence of changes in the structure of the workpiece during a single cycle of the process of FIG. 2.
Figure 2B:
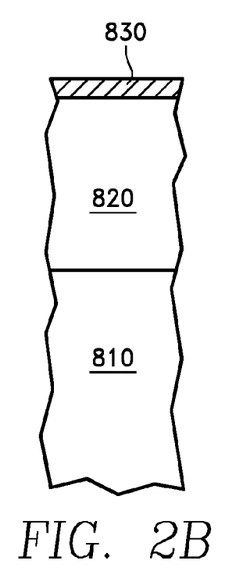
Figure 2C:
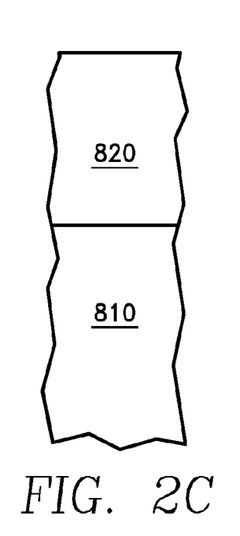

FIGS. 2A, 2B and 2C depict a sequence of changes in the structure of the workpiece during a single cycle of the process of FIG. 2. FIG. 2A depicts the workpiece including a substrate or base layer 810 (e.g., a Silicon layer) and an overlying deposited layer 820, which may be Silicon dioxide. In FIG. 2B, a top atomic layer 830 of the deposited layer 820 has been passivated. In FIG. 2C, the top atomic layer 830 has been removed by etching. If the deposited layer 820 is a dielectric such as Silicon dioxide or Silicon nitride, then the etching gas may comprise a combination of a fluorocarbon gas, oxygen and argon. The fluorocarbon may be for example, C4F8, CHF3, CH2F2, CF4 or the like. The passivating gas may comprise Chlorine.

Figure 3:
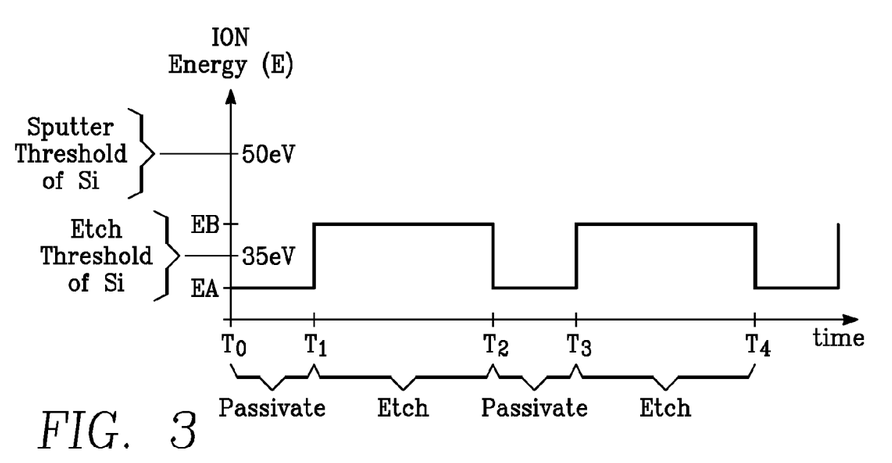
FIG. 3 is a timing diagram depicting the ion energy as a function of time in the process of FIG. 2.
Figure 4:
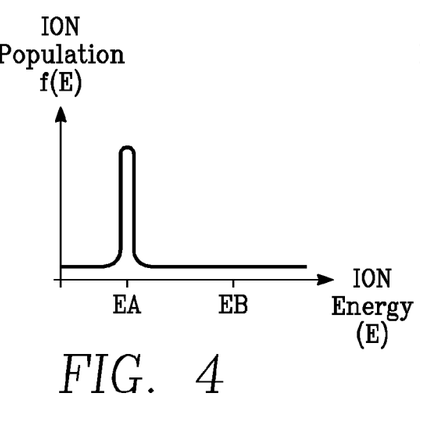
FIGS. 4 and 5 depict ion energy distribution functions during different periods of the process of FIGS. 2 and 3.
Figure 5:
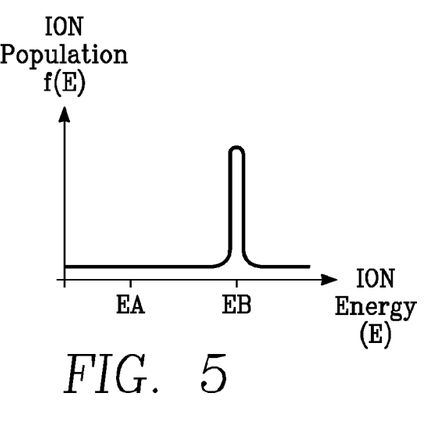

FIG. 3 illustrates the ion energy selection as a function of time in the process of FIG. 2. From time T0 to time T1, the passivation process is performed, during which the ion energy is selected to be EA, which is below the etch threshold of the layer 830. The corresponding ion energy distribution function is depicted in FIG. 4. If the deposited layer 820 is silicon dioxide, the etch threshold of the top atomic layer 830 is about 35 ev. From time T1 to time T2, the etch process is performed, during which the ion energy is selected to be EB, which is above the etch threshold of the atomic layer 830 but below the etch threshold of the base layer 810. The corresponding ion energy distribution function is depicted in FIG. 5. If the base layer 810 is silicon, then the etch threshold of the base layer 810 is about 50 ev. The ion energy level EB is a value between 35 ev and 50 ev in this example.

Figure 6A:
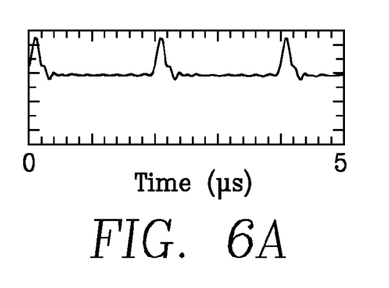
FIG. 6A is a graph depicting a tailored time domain waveform of RF bias voltage applied to the workpiece.
Figure 6B:
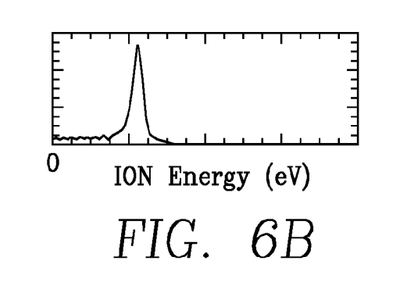
FIG. 6B depicts an ion energy distribution function produced by the waveform of FIG. 6A.
Figure 7A:
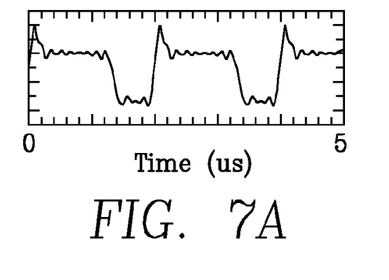
FIG. 7A is a graph depicting a tailored time domain waveform of RF bias voltage applied to the workpiece.
Figure 7B:
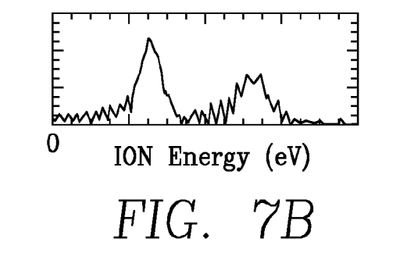
FIG. 7B depicts an ion energy distribution function produced by the waveform of FIG. 7A.
Figure 8A:
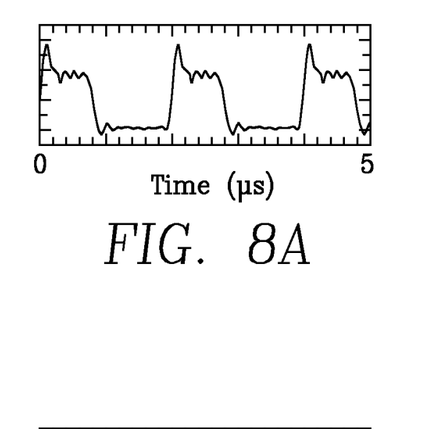
FIG. 8A is a graph depicting a tailored time domain waveform of RF bias voltage applied to the workpiece.
Figure 8B:
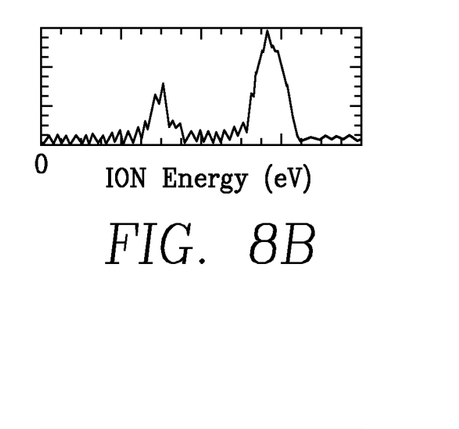
FIG. 8B depicts an ion energy distribution function produced by the waveform of FIG. 8A.
Figure 9A:
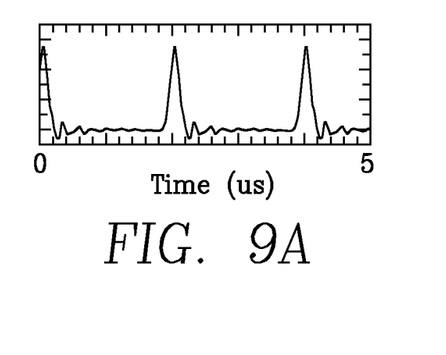
FIG. 9A is a graph depicting a tailored time domain waveform of RF bias voltage applied to the workpiece.
Figure 9B:
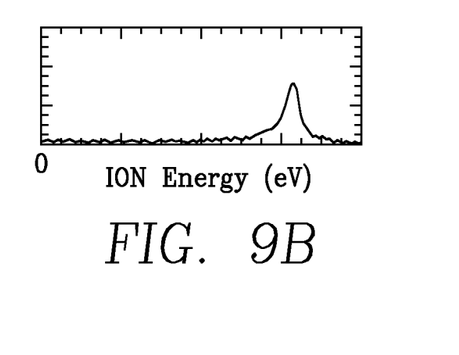
FIG. 9B depicts an ion energy distribution function produced by the waveform of FIG. 9A.

FIGS. 6A, 7A, 8A and 9A depict different time domain tailored waveforms of RF bias voltage (or current) provided by the waveform tailoring processor 214. FIGS. 6B, 7B, 8B and 9B depict ion energy distribution functions produced by corresponding ones of the waveforms of FIGS. 6A, 7A, 8A and 9A. The waveform of FIG. 6A produces a single narrow ion energy distribution peak at a lower ion energy as shown in FIG. 6B, while the waveform of FIG. 9A produces a single narrow ion energy distribution peak at a higher ion energy as shown in FIG. 9B. Thus, selecting different ion energy levels is performed by selecting different tailored waveforms. In one embodiment, the controller 222 selects a particular tailored waveform that produces a narrow ion energy distribution having a single peak at the desired ion energy level.

Figure 10:
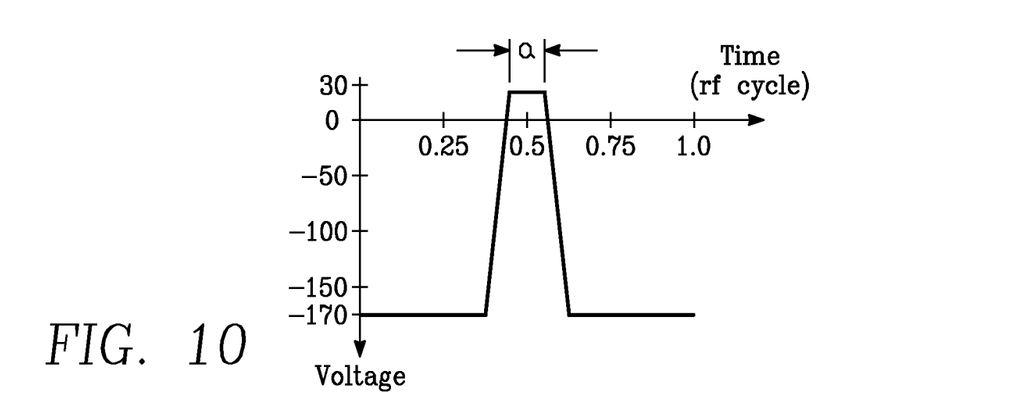
FIG. 10 depicts another time domain waveform of RF bias voltage in an alternative embodiment.

FIG. 10 depicts a time domain waveform of RF bias voltage which may be tailored by varying the width of a peak labeled "α" in FIG. 10. Varying the width of α changes the center energy level of the ion energy distribution.

One implementation of the electron beam source 120 is depicted in FIG. 1, although any suitable design may be employed in carrying out embodiments described herein. The electron beam source 120 of FIG. 1 includes a plasma generation chamber 122 spaced from the processing chamber 100 and having a conductive (or partially conductive) enclosure 124. The conductive enclosure 124 has a gas inlet 125. An electron beam source gas supply 127 is coupled to the gas inlet 125. The conductive enclosure 124 has an opening 124a facing the processing region 118 through an opening 102a in the side wall 102 of the processing chamber 100.

The electron beam source 120, in one embodiment, includes an extraction grid 126 adjacent the opening 124a and the plasma generation chamber 122, and an acceleration grid 128 adjacent the extraction grid 126 and facing the processing region 118. The extraction grid 126 and the acceleration grid 128 may each be formed as either a conductive mesh or a slotted electrode, for example, and are herein referred to generically as grids. Electrical contact to the extraction grid 126 is provided by a conductive ring 126a surrounding the extraction grid. Electrical contact to the acceleration grid 128 is provided by a conductive ring 128a surrounding the acceleration grid 128. The extraction grid 126 and the acceleration grid 128 are mounted with insulators 130, 132, respectively, so as to be electrically insulated from one another and from the conductive enclosure 124. However, the acceleration grid 128 is in electrical contact with the side wall 102 of the chamber 100. The openings 124a and 102a and the extraction and acceleration grids 126, 128 are mutually congruent, generally, and define a thin wide flow path for an electron beam into the processing region 118. The width of the flow path is about the diameter of the workpiece 206 (e.g., 100-400 mm) while the height of the flow path is less than about two inches. The flow path of the electron beam is generally parallel to an in-chamber beam axis 129 that is generally parallel with the ceiling 106 and generally parallel with a plane of the workpiece 206.

A pair of electromagnets 134-1 and 134-2 are adjacent opposite ends of the chamber 100, the electromagnet 134-1 being near the electron beam source 120. The two electromagnets 134-1 and 134-2 produce a magnetic field parallel to the electron beam path along the in-chamber beam axis 129. The electron beam flows across the processing region 118 over the workpiece 206, and is absorbed at the opposite end of the processing region 118 by a beam dump 136. The beam dump 136 is a conductive body having a shape adapted to capture the wide thin electron beam. The beam dump 136 may be coupled to ground through a shunt resistor 138.

The electron beam source 120 may produce plasma within the plasma generation chamber 122 by a power source coupled to a source power applicator in or adjacent the plasma generation chamber 122. The density of plasma produced by the electron beam in the processing region 118 may be controlled by controlling the power level of the power source or the electron beam source, for example. Alternatively or in addition, the plasma density in the processing region 118 may be controlled by controlling the gas flow rate from the electron beam source gas supply 127 to the gas inlet 125.

In one embodiment, the electron beam source 120 is an inductively coupled plasma source, in which case the source power applicator is a coil antenna and the power source is an RF power generator. In another embodiment, the electron beam source 120 is a capacitively coupled plasma source, in which case the source power applicator is an electrode or a wall of the plasma generation chamber 122 and the power source is an RF power generator. Alternatively, the electron beam source 120 may be a microwave plasma source. In yet another embodiment, the electron beam source 120 is a D.C. discharge plasma source, in which case the source power applicator is a wall of the plasma generation chamber 122 and the power source is a D.C. discharge voltage supply 140. This latter embodiment is depicted in the drawing of FIG. 1.

A negative terminal of the D.C. discharge voltage supply 140 is coupled to the conductive enclosure 124, and a positive terminal of the D.C. discharge voltage supply 140 is coupled to the extraction grid 126. In turn, a negative terminal of an electron beam acceleration voltage supply 142 is coupled to the extraction grid 126, and a positive terminal of the acceleration voltage supply 142 is connected to ground. In one embodiment the acceleration grid 128 is grounded. The acceleration voltage supply 142 is connected between the extraction grid 126 and the acceleration grid 128. A coil current supply 146 is coupled to the electromagnets 134-1 and 134-2. Electrons are extracted from the plasma in the plasma generation chamber 122 through the extraction grid 126 and the acceleration grid 128 to produce an electron beam that flows into the processing chamber 100. Electrons are accelerated to energies corresponding to the voltage provided by the acceleration voltage supply 142.

A chiller plate 131 may be interposed between the ceramic insulator 130 and the extraction grid 126. The chiller plate 131 may be metallic and include internal coolant flow passages (not illustrated). In one embodiment, the chiller plate 131 contacts the extraction grid 126, and the discharge voltage supply 140 and the acceleration voltage supply 142 may be coupled to the extraction grid 126 by connection to the chiller plate 131, as shown in FIG. 1.

In order for the controller 222 to govern the electron energy of the electron beam produced by the electron beam source 120, the electron beam energy control output 222a of the controller 222 is coupled to govern the output voltage level of the acceleration voltage supply 142 (and/or the discharge voltage supply 140).

In an alternative embodiment, deposition on a workpiece is performed by performing the operations of blocks 722, 724, 730 and 732 of FIG. 2 using a process gas containing species to be deposited. In this alternative embodiment, block 732 is performed to set the ion energy to a level that promotes deposition. The ion energy is controlled by tailoring the wave form of the RF bias power coupled to the workpiece, in the manner described above.

Advantages

One advantage is that ion energy control is very precise because the electron beam generating a plasma with extremely low ion energy, and therefore makes only a negligible contribution to ion energy, leaving the control of ion energy to the tailoring of the RF bias power waveform.

A related advantage is that the waveform tailoring of the RF bias voltage (or current) coupled to the workpiece provides an accurate way of precisely setting ion energy within a narrow range centered at the desired energy level. The width of ion energy distribution is narrow so that, during passivation, only a negligible number of ions have energies exceeding the etch threshold. Moreover, during etching, only a negligible number of ions have energies below the etch threshold of the passivated material or above the etch threshold of the base layer. An advantage is that the atomic layer etch process is more precise.

While the foregoing is directed to embodiments of the present invention, other and further embodiments of the invention may be devised without departing from the basic scope thereof, and the scope thereof is determined by the claims that follow.

What is claimed is:

1. A method of removing an overlying film from a workpiece, comprising:
   supporting the workpiece in a chamber;
   coupling an RF bias voltage to said workpiece;
   (A) performing a passivation process for a time duration corresponding to a desired thickness of a layer of said overlying film to be passivated, said passivation process comprising:
   introducing a passivation process gas into said chamber;
   generating a plasma in said chamber for passivation, by radiating gas in said chamber with an electron beam having a beam direction parallel to a plane of said workpiece from an electron beam generator;
   controlling said RF bias voltage to set energy of ions in said chamber to a first ion energy level less than a first minimum ion energy required for etching said overlying film;
   (B) performing an etching process by:
   introducing an etching process gas into said chamber;
   generating a plasma in said chamber for etching, by radiating gas in said chamber with an electron beam having a beam direction parallel to a plane of said workpiece from an electron beam generator;
   controlling said RF bias voltage to set energy of ions in said chamber to a second ion energy level exceeding said first minimum ion energy;
   wherein said controlling said RF bias voltage to set energy of ions to a first ion energy level comprises conforming a time domain waveform of said RF bias voltage to an RF waveform in which the RF voltage is at a level corresponding to said first ion energy level for a duration of about 50% of a continuous wave RF cycle of said RF waveform; and
   wherein said controlling said RF bias voltage to set energy of ions to a second ion energy level comprises conforming a time domain waveform of said RF bias voltage to an RF waveform in which the RF voltage is at a level corresponding to said second ion energy level for a duration of about 50% of a continuous wave RF cycle of said RF waveform.

2. The method of claim 1 wherein said workpiece comprises a base material under said overlying film, and said second ion energy level is less than a second minimum ion energy required to etch said base material.

3. The method of claim 1 wherein said desired thickness is one atomic layer.

4. The method of claim 1 wherein said passivating is performed for a time duration sufficiently short to limit thickness of said layer to one atomic layer.

5. The method of claim 1 wherein said passivating gas contains a halogen species.

6. The method of claim 1 wherein said passivating gas contains Chlorine.

7. The method of claim 2 wherein said overlying film comprises Silicon dioxide or Silicon nitride and said base material comprises crystalline Silicon.

8. A method of performing atomic layer etching of an overlying film on a workpiece, comprising:
   coupling an RF bias voltage to said workpiece;
   passivating a predetermined thickness of a layer of said overlying film, comprising introducing into said chamber a gas containing a passivation species and generating a plasma in said chamber for passivation by radiating gas in said chamber with an electron beam having a beam direction parallel to a plane of said workpiece from an electron beam generator;
   etching the predetermined thickness of said layer, comprising introducing into said chamber a gas containing an etch species and generating a plasma in said chamber for etching by radiating gas in said chamber with an electron beam having a beam direction parallel to a plane of said workpiece from an electron beam generator;
   during said passivating, setting energy of ions in said chamber to a first ion energy level less than a first minimum ion energy for etching said layer by conforming a time domain waveform of said RF bias voltage to an RF waveform in which the RF voltage is at a level corresponding to said first ion energy level for a duration of at least 50% of an RF cycle of said RF waveform;
   during said etching, setting energy of ions in said chamber to a second ion energy level exceeding said first minimum ion energy by conforming a time domain waveform of said RF bias voltage to an RF waveform in which the RF voltage is at a level corresponding to said second ion energy level for a duration of at least 50% of an RF cycle of said RF waveform.

9. The method of claim 8 further comprising:
   limiting said passivating to a time duration corresponding to said predetermined thickness.

10. The method of claim 9 wherein said predetermined thickness corresponds to a predetermined number of atomic layers of said layer.

11. The method of claim 10 wherein said predetermined thickness corresponds to a single atomic layer.

12. The method of claim 11 further comprising repeating said passivating and etching in successive operations until removal of said layer is complete.

13. The method of claim 8 further comprising introducing a passivating process gas during said passivating and introducing an etch process gas during said etching.

14. A method of removing an overlying film on a workpiece in a chamber, comprising:
   performing alternating operations of passivating and etching;
   wherein said passivating comprises: introducing into said chamber a gas containing a passivation species and generating a plasma in said chamber for passivation by radiating gas in said chamber with an electron beam having a beam direction parallel to a plane of said workpiece from an electron beam generator;
   wherein said etching comprises: introducing into said chamber a gas containing an etch species and generating a plasma in said chamber for etching by radiating gas in said chamber with an electron beam having a beam direction parallel to a plane of said workpiece from an electron beam generator;

during said passivating, tailoring RF bias power to a waveform in which RF voltage is at a level corresponding to a first ion energy level less than an etch threshold of said overlying film for a duration of at least 50% of an RF cycle of said waveform; and during said etching, tailoring RF bias power to a waveform in which RF voltage is at a level corresponding to a second ion energy level exceeding an etch threshold of said overlying film for a duration of at least 50% of an RF cycle of said waveform.

15. The method of claim 14 further comprising:

limiting said passivating to a time duration corresponding to a predetermined thickness of a layer of said overlying film.

16. The method of claim 15 wherein said predetermined thickness corresponds to an atomic layer.

\* \* \* \* \*